(12) United States Patent
Agahdel et al.

(10) Patent No.: US 6,937,044 B1
(45) Date of Patent: *Aug. 30, 2005

(54) BARE DIE CARRIER

(75) Inventors: Fariborz Agahdel, San Jose, CA (US); Brad Griswold, San Jose, CA (US); Syed Husain, Milpitas, CA (US); Robert Moti, San Jose, CA (US); William C. Robinette, Jr., Los Altos, CA (US); Chung W. Ho, Monte Sereno, CA (US)

(73) Assignee: Kulicke & Soffa Industries, Inc., Willow Grove, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/534,729

(22) Filed: Mar. 24, 2000

Related U.S. Application Data

(63) Continuation of application No. 08/542,685, filed on Oct. 13, 1995, now Pat. No. 6,049,215, which is a continuation of application No. 08/408,048, filed on Mar. 21, 1995, now abandoned, which is a continuation of application No. 07/979,719, filed on Nov. 20, 1992, now Pat. No. 5,402,077.

(51) Int. Cl.$^7$ .......................... G01R 31/02; G01R 31/28
(52) U.S. Cl. ....................... 324/758; 324/755; 324/765
(58) Field of Search ................................ 324/758, 754, 324/755, 765, 158.1

(56) References Cited

U.S. PATENT DOCUMENTS

| | | |
|---|---|---|
| 3,766,439 A | 10/1973 | Isaacson |
| 3,832,632 A | 8/1974 | Ardezonne |
| 4,169,642 A | 10/1979 | Mouissie |
| 4,329,642 A | 5/1982 | Luthi et al. |
| 4,341,432 A | 7/1982 | Cutchaw |
| 4,341,842 A | 7/1982 | Lampe |

(Continued)

FOREIGN PATENT DOCUMENTS

| | | |
|---|---|---|
| EP | 0298219 | 11/1989 |
| EP | 0452114 A2 | 10/1991 |
| EP | 0588491 A2 | 8/1993 |
| EP | 0600604 A1 | 10/1993 |
| WO | W/O 88/05544 | 7/1988 |

OTHER PUBLICATIONS

"Decal Contactor With Decoder", author unknown, Reseaarch Disclosure, No. 32636, Jun. 1991.*

Known–Good Die: A Key to Cost Effective "MCMs", Electronic Packaging and Production by Gene Cloud, Tim Corbett, Jerry Johnson and Alan Wood, Sep. 1992.

*Primary Examiner*—Ernest Karlsen
(74) *Attorney, Agent, or Firm*—Synnestvedt & Lechner LLP

(57) ABSTRACT

A bare semiconductor circuit die carrier is provided for use in the test of semiconductor circuits, the carrier, comprising: a substrate defining an opening and an outer perimeter; a multiplicity of I/O pads disposed about the perimeter; an interconnect circuit which includes a composite of a multiplicity of individual electrical conductors which are formed in a polymer dielectric; wherein the interconnect circuit overlays a top surface of the substrate and extends across the opening so as to form a flexible membrane that spans the opening; a multiplicity of die contact pads connected to the conductors are disposed about the flexible membrane with particles deposited on the die contact pads; a fence upstanding from the membrane and sized to receive a test die; a top cap that rests upon the die when the die is received within the fence; a bottom cap that rests against a bottom surface of the substrate; and a fastener for securing the top cap to the bottom cap with the die disposed therebetween.

28 Claims, 13 Drawing Sheets

U.S. PATENT DOCUMENTS

| | | | |
|---|---|---|---|
| 4,386,815 A | 6/1983 | Carter et al. |
| 4,427,249 A | 1/1984 | Bright et al. |
| 4,567,432 A | 1/1986 | Boul et al. |
| 4,597,617 A | 7/1986 | Enochs |
| 4,679,118 A | 7/1987 | Johnson et al. |
| 4,684,184 A | 8/1987 | Grabbe et al. |
| 4,750,890 A | 6/1988 | Dube et al. |
| 4,782,289 A | 11/1988 | Schwar et al. |
| 4,783,719 A | 11/1988 | Jamison et al. |
| 4,789,345 A | 12/1988 | Carter |
| 4,804,132 A | 2/1989 | DiFrancesco |
| 4,812,191 A | 3/1989 | Ho et al. |
| 4,832,612 A | 5/1989 | Grabbe et al. |
| 4,846,703 A | 7/1989 | Matsuoka et al. |
| 4,846,704 A | 7/1989 | Ikeya |
| 4,859,189 A | 8/1989 | Petersen et al. |
| 4,883,428 A | 11/1989 | Tonooka |
| 4,922,376 A | 5/1990 | Pommer et al. |
| 5,006,792 A | 4/1991 | Malhi et al. |
| 5,066,357 A | 11/1991 | Smyth et al. |
| 5,073,117 A | 12/1991 | Malhi et al. |
| 5,083,697 A | 1/1992 | DiFrancesco |
| 5,123,850 A | 6/1992 | Elder et al. |
| 5,127,837 A | 7/1992 | Shah et al. |
| 5,176,525 A | 1/1993 | Niecescher et al. |
| 5,180,976 A | 1/1993 | Van Loan et al. |
| 5,225,037 A | 7/1993 | Elder et al. |
| 5,302,891 A | * 4/1994 | Wood et al. | 324/765 |
| 5,397,245 A | 3/1995 | Roebuck et al. |
| 5,402,077 A | * 3/1995 | Agahdel et al. | 324/758 |
| 5,468,157 A | 11/1995 | Roebuck et al. |
| 6,049,215 A | * 4/2000 | Agahdel et al. | 324/758 |

* cited by examiner

BARE DIE CARRIER

This application is a continuation of application Ser. No. 08/542,685, filed Oct. 13, 1995, now U.S. Pat. No. 6,049,215 which is a continuation of application Ser. No. 08/408,048, filed Mar. 21, 1995, now abandoned, which is a continuation of Ser. No. 07/979,719, filed Nov. 20, 1992, now U.S. Pat. No. 5,402,077.

BACKGROUND OF THE INVENTION

1. Field of the Invention

The invention relates generally to the testing of semiconductor circuits and more particularly, to die carriers used to make electrical contact with the pads of a bare semiconductor circuit die during functional and burn-in testing.

2. Description of the Related Art

A major challenge in the production of multichip modules is the identification of defective integrated circuit chips. The yield rate of multichip modules can be significantly increased through the use of fully tested and burned-in die. The testing of die prior to packaging or assembly into multichip modules reduces the amount of rework which in turn decreases manufacturing costs.

Functional tests determine whether a semiconductor circuit operates in accordance with prescribed specifications. Burn-in tests identify latent or inherent manufacturing defects caused by factors like contamination or process variations during manufacture. Such defects can cause early failure. Burn-in tests subject the die to electrical stress at high power supply voltages with increased temperatures so as to accelerate such early failure to the point of detection.

One problem with the testing of bare die is that as circuit dimensions have become smaller, so have the pads on the die surfaces. Moreover, these smaller pads often are packed more closely together. As a result, it sometimes can be impractical to use devices such as probe cards to make electrical contact with die pads for testing purposes. Another problem with probe cards has been their relatively poor performance in testing high frequency signals.

Some of the shortcomings of probe cards have been overcome through the use of temporary die carriers. For example, gold can be applied to the contact pads of a die, and the die can be placed in a temporary carrier in which it is held in electrical contact with gold pads on the carrier through the application of pressure to the pad-to-pad interface. The use of gold, however, can be too expensive for many semiconductor processes. Another approach is to wire bond the die pads to an intermediate test package. Although the die can be removed from the package after testing by removal of the wire bonds, this can result in damage to the circuit. Consequently, some manufacturers include both the die and its intermediate test package in the final IC package in order to reduce the possibility of such damage.

Still another approach is disclosed in U.S. Pat. No. 5,123,850 issued to Elder et al which teaches the use of an interconnect circuit formed in a resilient membrane to make temporary electrical contact with pads disposed on a die. The interconnect circuit is formed from alternating layers of polyimide dielectric and metal signal lines. Electrical contact bumps protrude from a top surface of the membrane and make electrical contact with individual signal lines. A semiconductor die is placed on the membrane and is aligned by visible means to ensure that the contact bumps are disposed opposite pads on the die. An insert plate is placed against a bottom surface of the membrane opposite the die. The interconnect circuit is wire bonded to a pin grid array (PGA) which can be plugged into a test socket base to communicate test signals to and from the carrier. A heat sink is clipped to the PGA, and the die is pressed between the heat sink and the membrane. The force exerted against the die is expected to cause the contact bumps to make electrical contact with the die pads.

While earlier carriers such as the one described above contain good design concepts there have been shortcomings with their use. For example, the gold coated bumps on the contact pads often do not make adequate contact with the die pads because of the build-up of an oxide layer on the die pads. In addition, the use of visual means to align the die with the flexible membrane can be somewhat clumsy and time consuming or may require elaborate vision and robotic systems. The use of wire bonding and the use of a PGA can be expensive. The wire bonding of the interconnect circuit to the PGA can make it difficult to interchange one interconnect circuit configured to test one type of die with another interconnect circuit configured to test another type of die. Furthermore, using the heat sink cavity to hold the die aligned to the membrane can be impractical and expensive.

Thus, there has been a need for an improved carrier for testing bare semiconductor circuit die. There has been a particular need for a carrier in which a flexible interconnect circuit can be easily aligned with the pads of a die. There also has been a need for an improved contact pad structure that can penetrate an oxide layer on the die pads. Furthermore, there has been a need for such a carrier in which test signals can be communicated to and from the carrier without the need to make wire bond connections or to use relatively expensive intermediate circuits such as PGAs to conduct signals to and from the carrier. In addition, there has been a need for a carrier in which one interconnect circuit can be readily interchanged with another interconnect circuit. The present invention meets these needs.

SUMMARY OF THE INVENTION

The present invention provides a new bare die carrier for use in testing semiconductor circuits. In a present embodiment, the carrier includes easily accessible I/O pads for conducting test signals to and from the carrier. This carrier has a fence that upstands from a flexible membrane and can be used to align the die with the interconnect circuit. It also includes a mechanism for adjusting the force with which the die is pressed against the interconnect circuit in order to ensure adequate electrical contact without causing damage.

A current implementation of the carrier includes a flexible interconnect circuit which overlays a top surface of a rigid substrate. The substrate defines an opening surrounded by a perimeter region. The interconnect circuit extends across the center opening so as to form a flexible membrane that spans the opening. A multiplicity of I/O pads are disposed about the perimeter of the substrate. Individual electrical conductors of the interconnect circuit are connected to individual I/O pads so as to form a multiplicity of individual electrical paths between the I/O pads and selected locations of the interconnect circuit where die contact pads are formed. A fence upstands from the interconnect circuit and is sized to receive a test die. A support member abuts against a bottom surface of the circuit. A top cap and a bottom cap are provided. The substrate and the die are secured between the top cap and the bottom cap.

The new carrier provides I/O pads which can be easily reached by circuit probes. There is no need to use expensive intermediate circuitry such as a PGA to communicate test signals with the carrier. The carrier can be easily dropped in a standard burn-in test socket so that the die in the carrier can be tested and burned in. The alignment fence obviates the need to visually align the die with the interconnect circuit. The novel carrier is a general purpose device. It can be used to house dies in a clean protected environment during transport of the die. By simply inserting a different substrate bearing a different interconnect circuit between the top and bottom caps, a different test die circuit design can be housed and tested. There is no need for elaborate steps, such as wire bonding to a PGA, to reconfigure the carrier to test a different type of die.

These and other purposes and advantages of the present invention will become more apparent to those skilled in the art from the following detailed description in conjunction with the appended drawings in which:

DETAILED DESCRIPTION OF THE PREFERRED EMBODIMENT

The present invention comprises a novel carrier for use in testing bare semiconductor circuit die. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
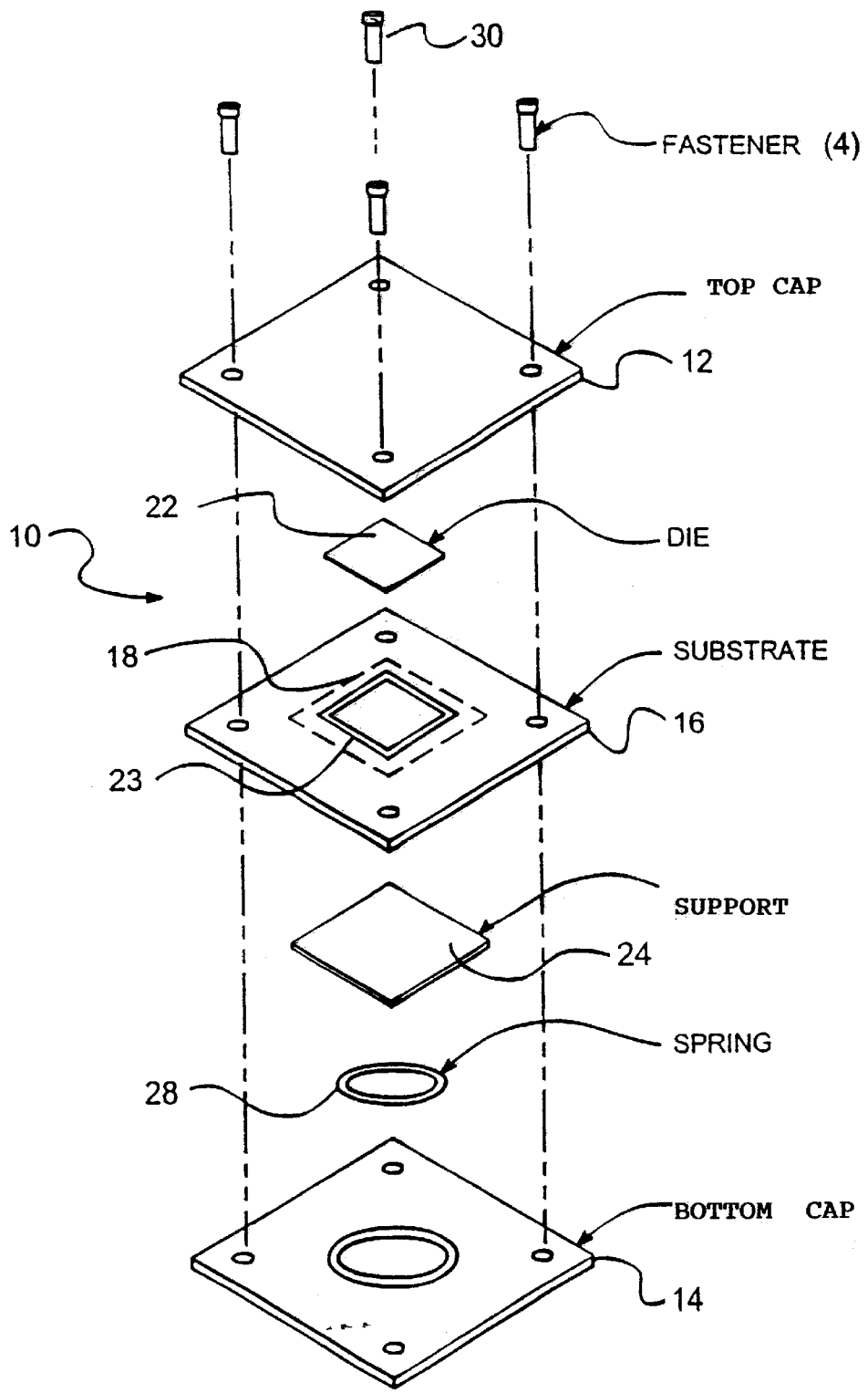
FIG. 1 is an exploded perspective view of a carrier in accordance with the present invention.

Referring to the illustrative drawings of FIG. 1, there is shown an exploded perspective view of a bare semiconductor circuit die carrier 10 in accordance with the present invention. The carrier 10 includes a top cap 12, a bottom cap 14 and a substrate 16. The substrate 16 has a central opening which extends through it indicated by dashed lines 18 and which is spanned by a flexible membrane 20. The dashed lines 18 also indicate an inner perimeter of the substrate 16. A bare semiconductor circuit die 22 is sized to fit within a fence 23 which upstands from a top surface of the flexible membrane 20. A support 24 abuts against a bottom surface of the membrane 20 within a recess defined by the opening in the substrate 16 indicated by dashed lines 18. The top cap 12 is secured to the bottom cap 14 by fastening mechanisms 30. A spring member 28 is disposed within the recess between the support 24 and the bottom cap 14. The spring member 28 urges the support 24 against the bottom surface of the membrane 20 when the top and bottom caps are fastened together.

Figure 2:
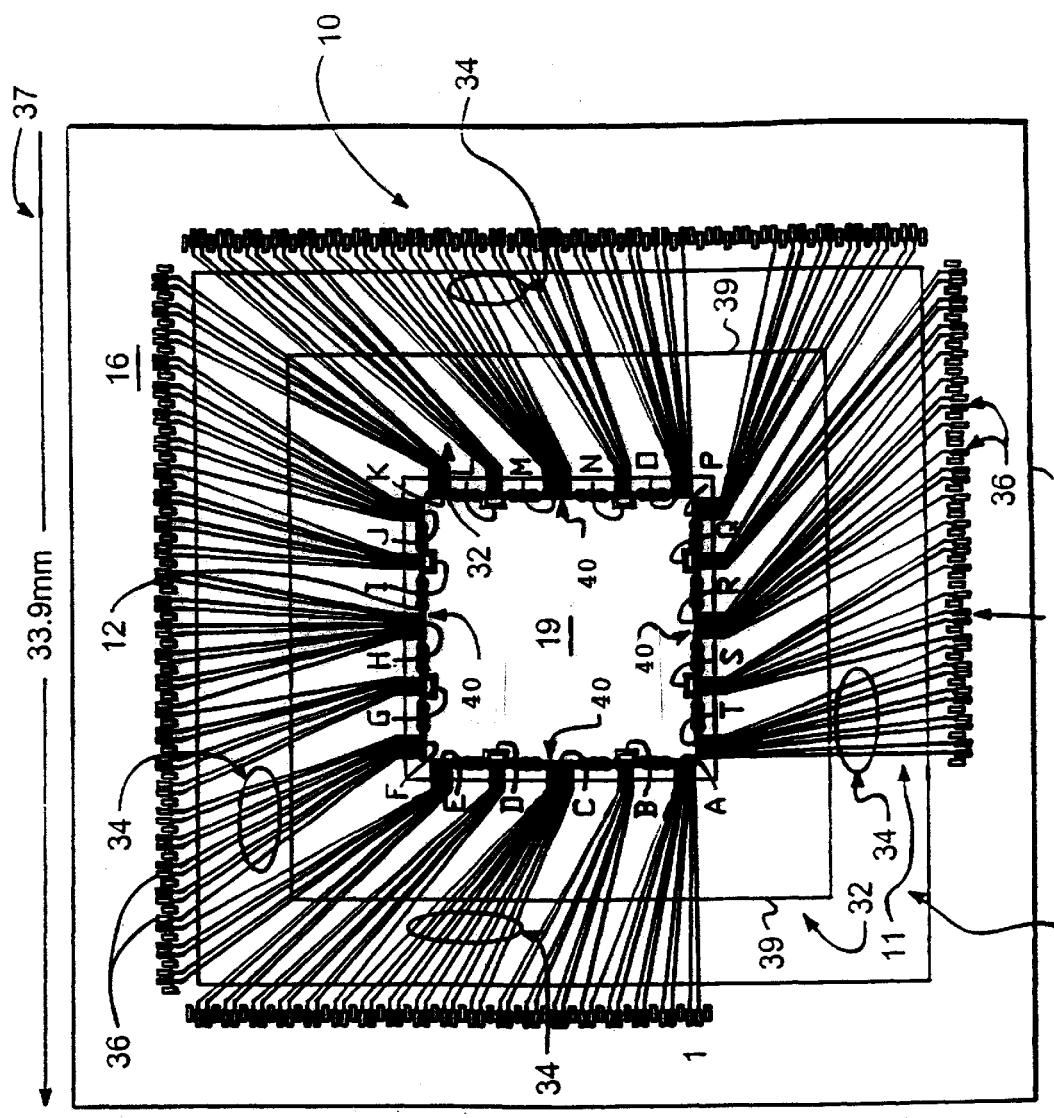
FIG. 2 is a top plan view of a substrate/interconnect circuit assembly of the carrier of FIG. 1 showing the interconnect circuit and a fence formed thereon.

Referring to the illustrative drawings of FIG. 2, there is shown a top plan view of the substrate/interconnect circuit assembly 37. A polymer dielectric is deposited on both the top and bottom surfaces of substrate 16. An interconnect circuit 32 is formed on the substrate top surface. The interconnect circuit 32 is comprised of a composite of a multiplicity of electrical conductors 34 formed in the polymer. This composite covers the entire top surface of the substrate and forms the flexible membrane 20 that extends across the opening in the substrate. A multiplicity of input/output (I/O) pads 36 are disposed about the perimeter of the substrate 16. Individual conductors 34 form conductive paths between individual pads 36 and prescribed contact pad locations in the flexible membrane 20. The rectangular fence 23, which upstands from the flexible membrane 20, is sized and contoured such that the semiconductor die 22 will become properly aligned with the interconnect circuit 32 when the die is inserted within the fence.

Thus, the fence is disposed on and upstands from the portion of the interconnect circuit 32 that is surrounded by or circumscribed by the opening 18 through the substrate 16. Consequently, when a test die 22 is placed within the fence, the membrane can flex in cooperation with the support 24 to keep the interconnect circuit 32 planarized for better electrical contact with the die.

It should be understood that, although the conductors 34 of the interconnect circuit 32 of FIG. 2 only extend to the edge of the fence 23, an alternative interconnect circuit (not shown) could be employed in which the conductors extended into more central portions of the flexible membrane 20. For example, certain semiconductor circuits use area pads deployed at locations other than the die periphery. In order to test such circuits, the substrate/interconnect circuit assembly must have conductors that extend further out into the membrane 20 so as to make electrical contact with such area pads.

Furthermore, while the interconnect circuit 32 of FIG. 2 has only a single layer of conductors, multiple conductor layers could be used consistent with the invention. The fabrication of a multilevel interconnect circuit 32 is disclosed in U.S. Pat. No. 4,812,191 issued to Ho et al. which is expressly incorporated herein by this reference.

In the present embodiment, the substrate 16 is formed from aluminum. However, other substrate materials such as copper, ceramic or silicon could be used. The polymer dielectric is polyimide. Polymer materials with an E value of 2 to 4 are particularly useful in this application. The interconnect conductors 34 are formed from copper, but other conductive materials such as aluminum could be employed.

During manufacture of the substrate/interconnect circuit assembly, the center opening is formed in the substrate and the polymer layer formed on the substrate. The top surface of the substrate 16 is first coated with pressure sensitive tape or photoresist, or possibly both, to provide mechanical and chemical protection for the electrical circuitry. A recess is then mechanically machined into the bottom surface of the substrate 16 through the polymer and into the aluminum. The recess is machined about 80% of the way through the substrate. For a 50 mil substrate, for example, the recess will be about 40 mils deep. The area of the recess will correspond to the size of the flexible membrane to be formed. Several recesses can be machined into a single large substrate to form multiple membranes, or single large recess can be machined, making one large membrane.

Any number of methods can be used to machine the recess. Milling, high-speed routing, EDM (electrostatic discharge machining), beadblasting through a mask can all be used, depending upon precision and cost constraints.

The recessed substrate is now chemically etched to remove the remaining 20% of the substrate thickness left in the bottom of the pocket, leaving intact the flexible membrane which spans the newly formed opening in the substrate. The bottom of the substrate is protected from the etchant by the backside polymer layer which forms a mask. Since the 20% remaining thickness of the substrate in the recess is thin relative to the thickness of the substrate in the recess area, little undercut occurs, even with an isotropic etchant.

Any number of etchants can be used as long as the insulating material used in forming the electrical circuits on the substrate is not chemically attacked by it. The etchant temperature must be carefully controlled to provide a constant etch rate. This is essential to controlling the tensile stress in the interconnect circuit. The protective layers on the top of the substrate are now removed.

The removal of the substrate from beneath a portion of the interconnect circuit leaves the flexible membrane 20 which spans the opening and defines the recess in the bottom surface of the substrate/interconnect circuit assembly in which the support member 24 is placed. In the current embodiment, the support member is formed from silicon so as to match the coefficient of thermal expansion of the silicon die under test. A top surface of the support member can have a polymer layer such as polyimide deposited on it to provide more compliance to the contact pads on the circuit.

Figure 3:
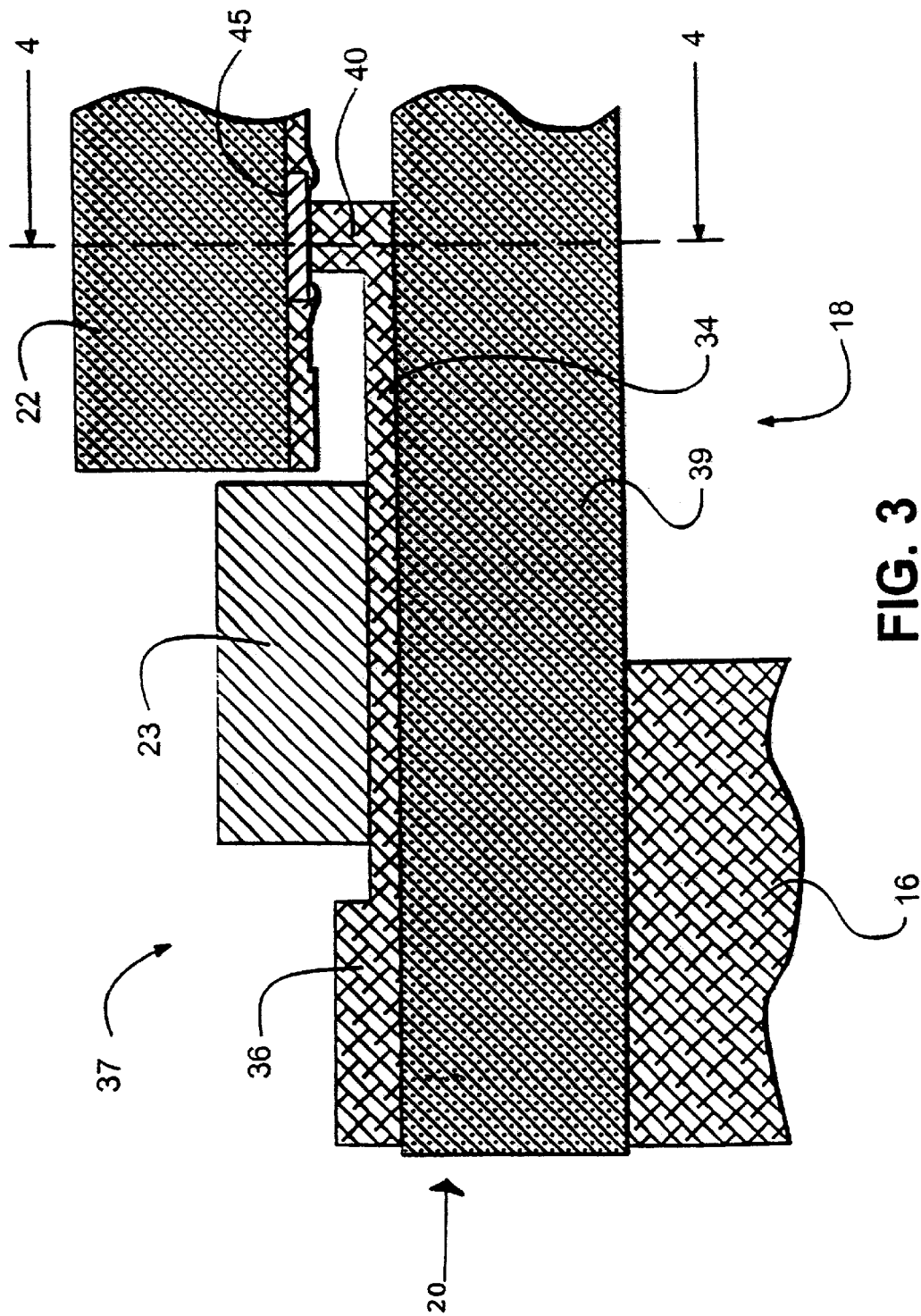
FIG. 3 is an enlarged cross-sectional view of the substrate/ interconnect circuit assembly of the carrier of FIG. 1.
Figure 4:
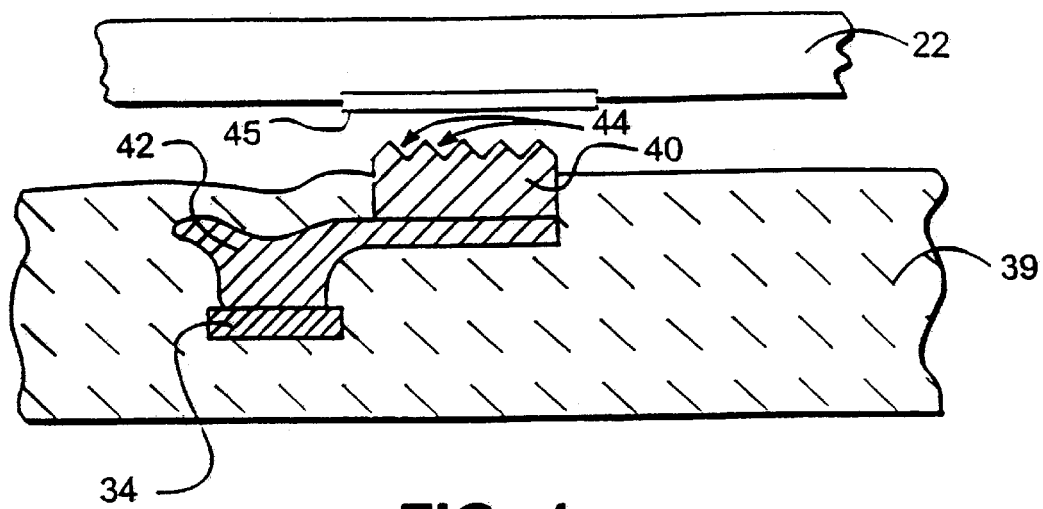
FIG. 4 is a cross-sectional view along line 4—4 of FIG. 3.

Referring to the illustrative drawing of FIG. 3, there is shown a cross-sectional view of a portion of the substrate/interconnect circuit assembly 37. A polyimide dielectric layer 39 has an electrical conductor 34 formed on it. The conductor 34 makes a connection with a contact pad 40 exposed on a top surface of the membrane 20. Portions of the top layer conductors are exposed; however, other conductors (not shown) can be buried in the polymer 39. In some cases multiple conductor layers are required to route signals. For example, FIG. 4 shows conductor traces 34 buried in the polymer, and FIG. 3 shows conductor traces partially exposed on top of the polymer and partially protected (covered) by the fence 23. The exposed contact pad 40 must be aligned with a corresponding pad 45 on the surface of the test die 22 in order for the conductor 34 to be able to form an electrical path between the die pad 45 and one of the I/O pads 36. The fence 23 is formed from a thicker polymer layer which overlays and protects the conductor 34. The fence is circumscribed or surrounded by the opening 18 formed in the substrate 16, and it extends outward to the I/O pad 36.

Referring to the illustrative drawings of FIG. 4, there is shown a cross sectional view along line 4—4 in FIG. 3. The conductor 34 is formed in the polymer layer 39. An electrical contact pad 40 is exposed on a top surface of the polymer layer 39 and is in electrical contact with conductor 34 via conductive path 42. A number of hard conductive particles 44 protrude from a top surface of the contact pad 40. An aluminum die pad 45 formed on a surface of the die 22 is aligned with electrical contact pad 40. As more fully described below, the particles 44 penetrate any impurity such as an oxide layer which may have formed on the surface of the aluminum die pad 45.

Figure 5:
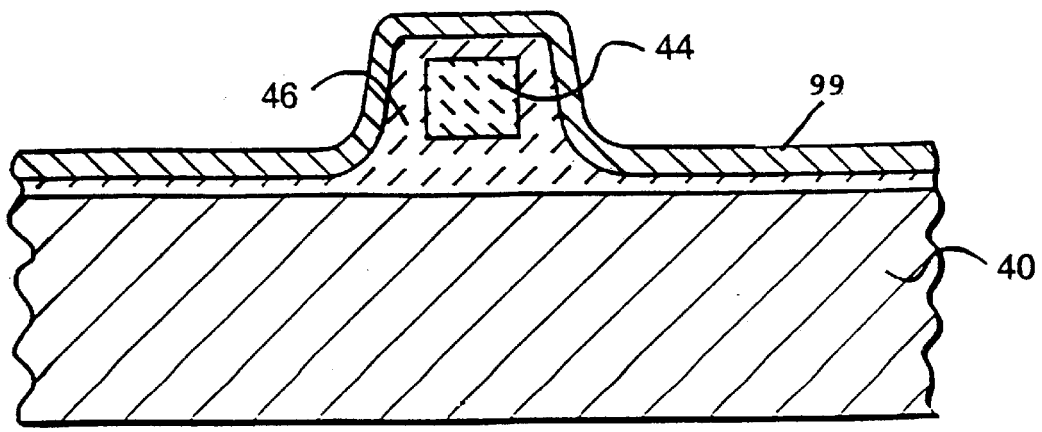
FIG. 5 is a cross-sectional view of a particle protruding from the contact of FIG. 4.

Referring to the illustrative drawing of FIG. 5, there is shown a somewhat enlarged cross sectional view of one of the particles 44 of FIG. 4. In the present embodiment, the particle is both mechanically hard and electrically conductive. The particle 44 is embedded in a layer of hard metal 46 (such as nickel or tungsten) which binds the particle to the contact pad 40. A layer of nonoxidizing metal 99 such as gold is deposited on the particle. The purpose of the gold layer is to keep the contact pad 40 from oxidizing and to facilitate electrical contact between the contact pad 40 and the die pad 45. Alternatively, nonconductive particles can be used if they are covered with an appropriate conductive material and have a hardness greater than the metal of the die pad 45.

Using partical plated contact pads obviates the need to devise elaborate mechanical schemes to generate a wiping action to push aside any oxide layer on pad 45. Instead, electrical contact is made by the particles penetrating through the oxide layer on pad 45 with a simple normal force.

The flexibility of the interconnect circuit membrane contributes to the achievement of electrical contact between each of the contact pads 40 and the die pads 45 for the following additional reasons. In practice, some contact pads 40 protrude upwards further from the interconnect circuit top surface than others. This is the result of typical manufacturing variations within prescribed tolerances. In order to ensure proper electrical contact with all such contact pads 40, however, it is necessary to equalize their height displacement. That is, it is necessary to planarize or level the pads 40 with respect to each other. Since the circuit membrane is compliant, a normal force applied by the properly aligned die 22 can push down those pads 40 that stand up too far so that all of the pads 40 are planarized. The compliance of the circuit membrane permits the pads 40 that jut upwards too far to be pushed downwards so as to be level with the other pads.

The purpose of the opening 18 is to afford additional compliance to the circuit 32. As an alernative, instead of providing an opening, the polymer dielectric of the fenced-in portion of the interconnect circuit could be made sufficiently thick to provide the desired degree of compliance. For example, it has been found that a polyimide layer approximately 36 microns thick can provide sufficient compliance in certain instances. As another alternative, instead of providing the opening, a thinned substrate region beneath the fenced-in portion of the interconnect circuit can provide the required compliance. For example, for a silicon or aluminum substrate, a thinned region approximately 5–10 mils thick can provide sufficient compliance depending upon the height tolerance in the manufacture of the pads 40 of the interconnect circuit. In each of these two alternative embodiments the substrate serves as a support for the interconnect circuit. Thus, the invention is not intended to be limited to a carrier with such a substrate opening.

From the foregoing discussion, it will be appreciated that the correct alignment of the die pads 45 with exposed contacts in the top surface of the membrane 20 is essential to the operation of the carrier. The purpose of the fence 23 is to register the die pads 45 with the exposed pads 40 of the membrane. The fence 23 obviates the need for an elaborate fixturing mechanism to achieve that alignment. The fence can be formed from any of a variety of materials such as, photoimagable polymers, photoimagable metals, mechanical plastics, a metal ring or any combination of these materials. Since the fence is formed by the same processing steps as the contact pads tight tolerances can be obtained for proper alignment operations.

An important consideration is the amount of force that must be applied to the die 22 in order to drive the particles 44 into conductive contact with the die pads 45. As explained above, a conductive coating layer, such as gold which is free of any oxide layer, is deposited on top of the particles 44 which are pressed against the die pad so as to penetrate any oxide layer on the die pad and form an electrical contact. Thus, sufficient force must be applied to drive the particles through any contaminant and to create electrical contact. The amount of force required can vary depending upon the number of pads on the test die. The more pads there are, the more force is required to create electrical contact with all of them.

Figure 6:
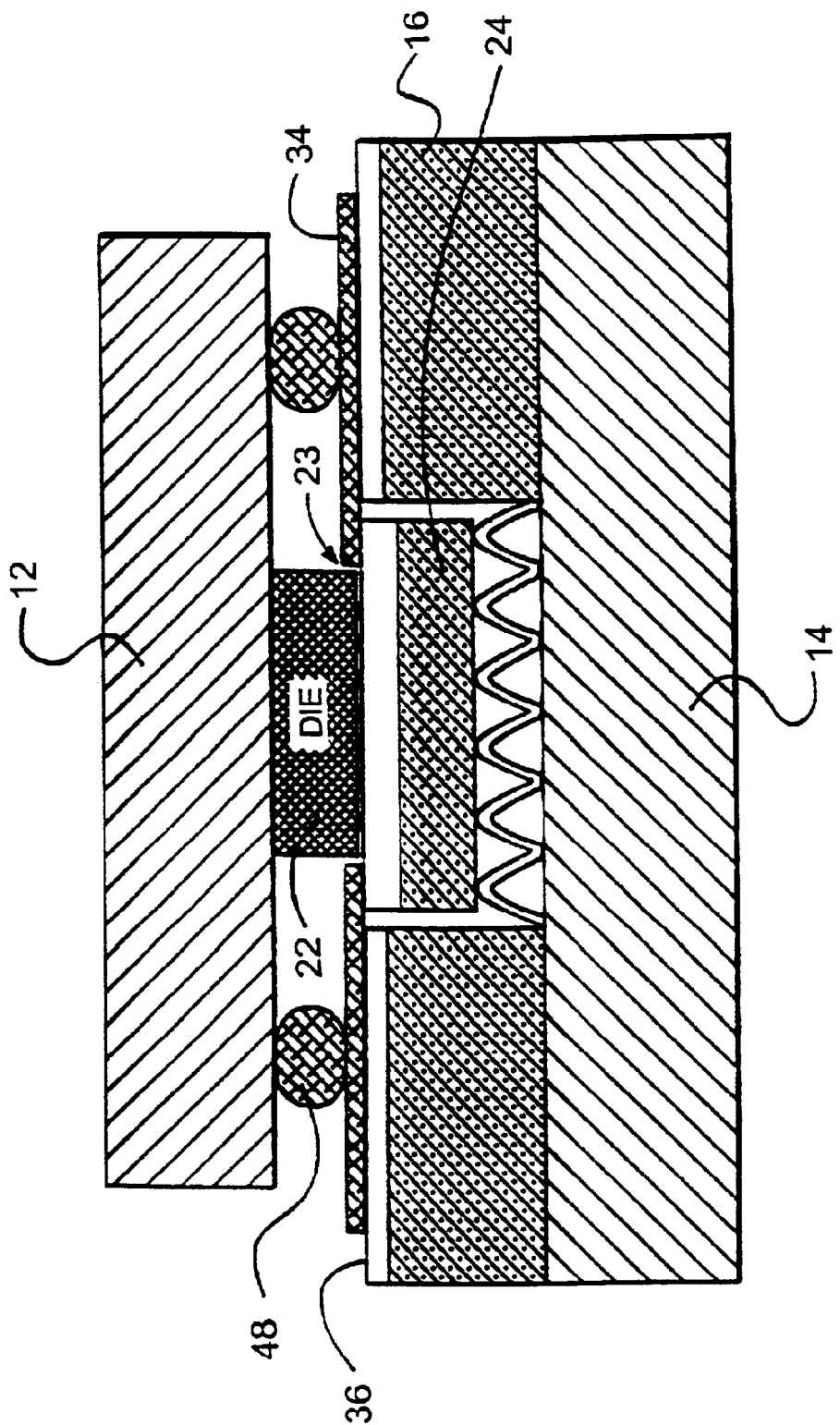
FIG. 6 is a cross-sectional diagram representing a fully assembled carrier in accordance with the present invention.

The carrier of the present invention advantageously permits the application of a controlled amount of force to the die. One mechanism for applying that force will be explained with reference to the drawings of FIG. 6 which shows a cross sectional view of an assembled carrier 10. Other possible mechanisms are explained with reference to subsequent drawings. The die 22 is received within a region defined by the fence 23. As explained above, in the present embodiment, the fence is formed from a raised layer of polyimide dielectric which extends from the fence to the outer perimeter of the substrate 16 so as to protect the interconnect circuit 32 from damage while at the same time leaving the I/O pads 36 at the edge of the substrate exposed. The substrate 16 rests upon the bottom cap 14. The top cap 12 abuts directly against the die 22. The top cap is sized so that it overhangs a portion of the interconnect circuit but does not interfere with access to the I/O pads 36. In the present embodiment, the top cap 12 and the bottom cap 14 are formed from a metal. Consequently, the top cap can serve as a heat sink for the die.

A spacer 48 is interposed between the top cap 12 and the substrate/interconnect circuit assembly. In the preferred embodiment, the spacer is made of teflon material. However, other dielectric or metal materials could be used. The purpose of the spacer is to prevent damage to the interconnect circuit 32 and to ensure that the membrane 20 is not overstressed due to inadvertent application of excessive force. The substrate 16 rests upon the bottom cap 14. The silicon support 24 is disposed within the recess beneath the membrane 20 between the spring member 28 and the membrane 20. The polymer layer formed on the silicon support abuts against the bottom surface of the membrane. The spring member urges the silicon support against the die.

Fasteners 30, shown in FIG. 1, are used to attach the top cap to the bottom cap. Spring clips, screws, clamps, rivets or other fastening means, such as those described with reference to FIGS. 11, 12A–B, 13A–B and 14A–B, could be used. The fasteners could be applied at all four corners of the top and bottom caps 12, 14 or to only two corners of the top and bottom caps 12, 14. The fasteners 30 provide a controlled displacement of the spring member 28. The closer the top and bottom caps are brought together by the fasteners 30, the greater will be the displacement of the silicon support. The silicon support, exerts a uniform and predictable force at the die/membrane interface. The amount of force can be regulated according to how many pads are located on the die. For example, if there are more pads on the die, then the fastening mechanisms would be secured so as to cause a greater displacement of the spring member 28 and a corresponding application of a greater uniform force to the die/substrate interface.

Figure 8:
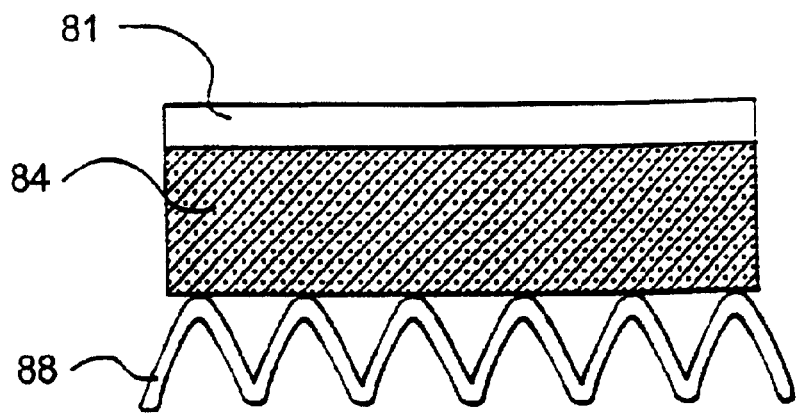
FIG. 8 is a side view of an alternate support member and spring member in accordance with the invention.
Figure 9:
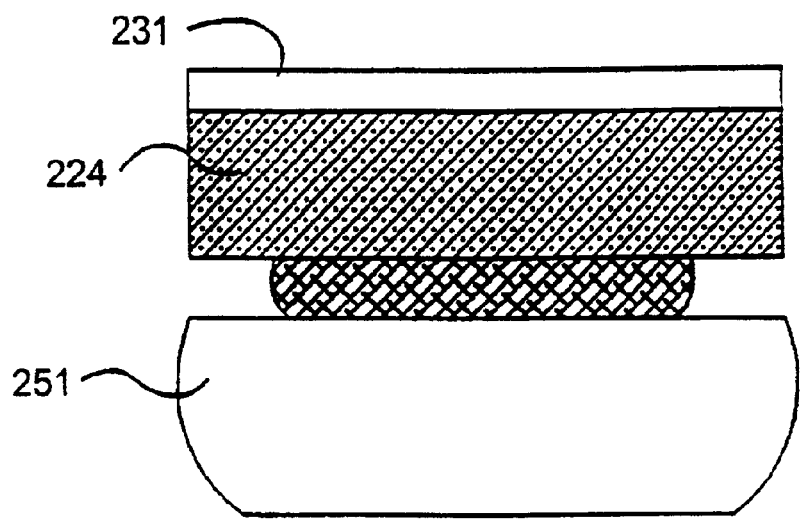
FIG. 9 is a side view of an alternate support member in accordance with the invention.
Figure 10:
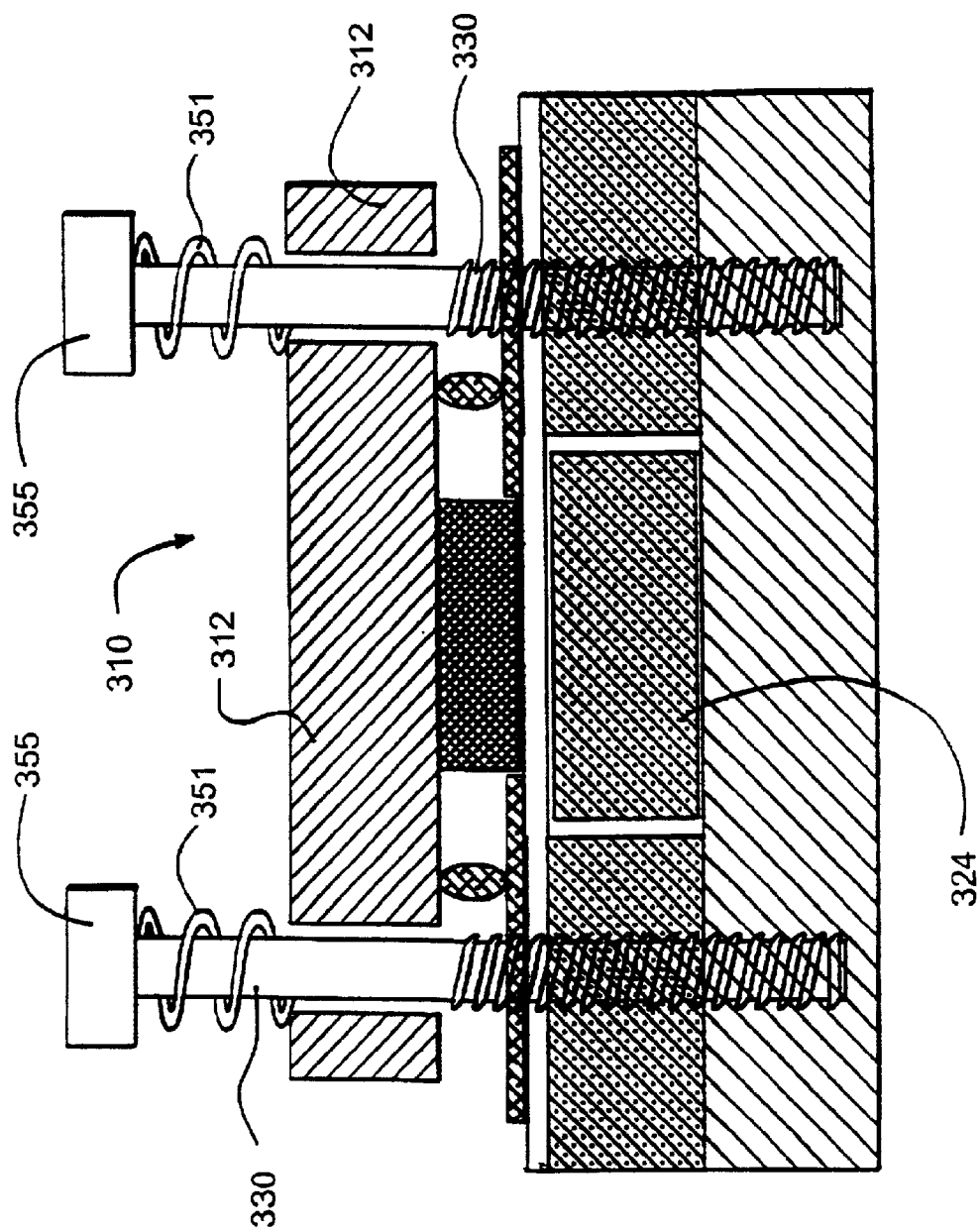
FIG. 10 is a cross-sectional view of an alternate embodiment of the invention which uses alternate means for providing a force to the die/interconnect circuit interface.

In the present embodiment, the spring member 28 is implemented using a spring which exerts a constant spring force within a certain range of displacement. That is, the spring member 28 applies the same force to the die regardless of variations in the thickness of the die and the carrier components (such as the top and bottom caps) within a prescribed tolerance range. Alternatively, an elastomer could be used as a spring member. As shown in FIG. 10, the force can also be applied from the top using the spring(s) 351 in which case the bottom spring is used to planarize the substrate/interconnect circuit assembly against the die. FIGS. 8 and 9 depict two possible implementations of such insert mechanisms. In FIG. 8, a spring or rubber elastomer is used for planarization, and in FIG. 9 spherical bearings such as a Torrington Spherical plain angular contact bearing Type SBT produced by Bearings, Inc. is used for planarization.

The polymer layer is formed on the surface of the support 24 with polyimide to provide a small amount of compliance under pressure. The silicon support 24 has a co-efficient of thermal expansion (CTE) which matches that of the silicon die under test. The use of a support with a CTE that matches that of the die helps to ensure that, as the die and the membrane expand at different rates with increased temperature (during burn-in testing for example) that the die pads 22 do not become misaligned with the exposed contacts 40 in the membrane 20.

Figure 7A:
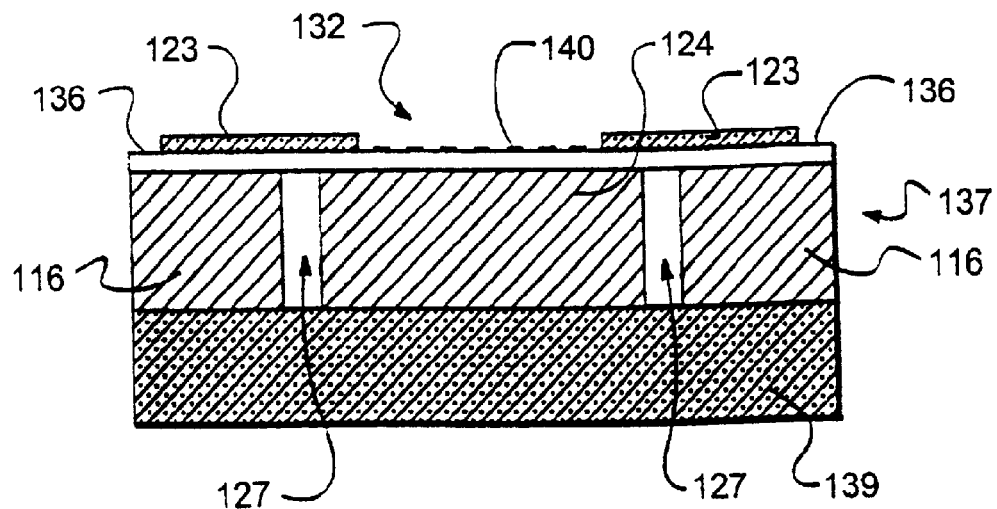
FIG. 7A is a cross-sectional view of an alternate substrate/ interconnect circuit assembly in accordance with the invention.
Figure 7B:
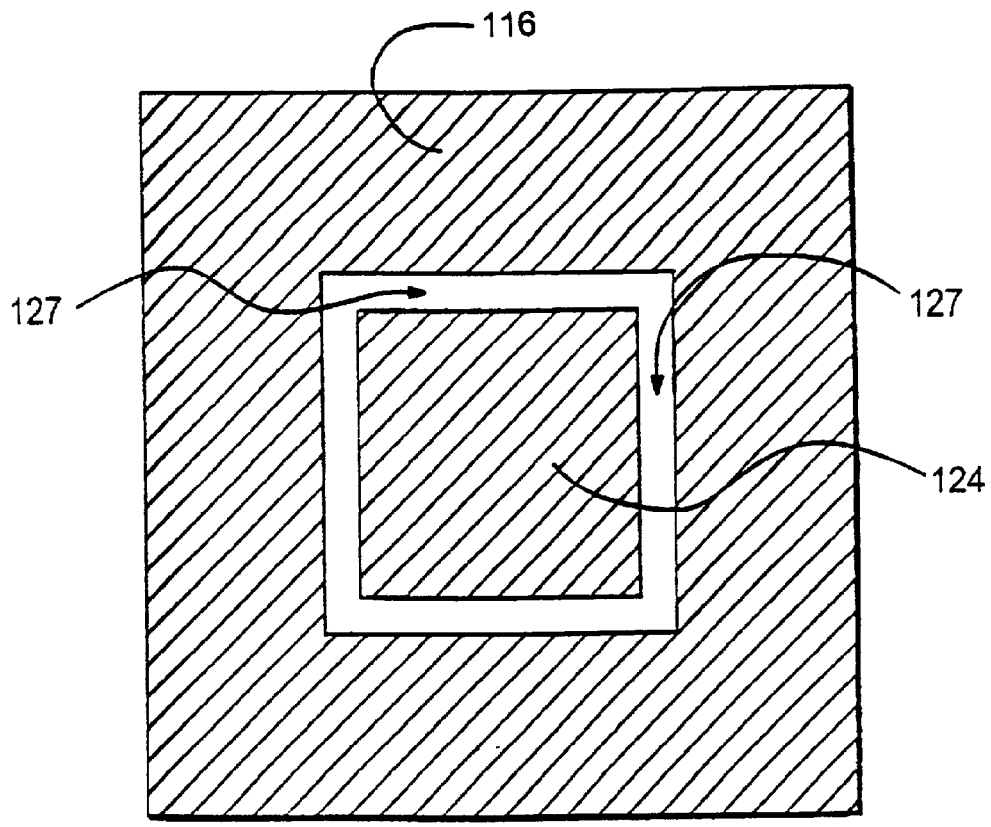
FIG. 7B is a bottom elevation view of the substrate and support member of the alternate assembly of FIG. 7A.

Referring to FIGS. 7A and 7B there is shown a cross-sectional view of an alternate substrate/interconnect assembly 137 and a bottom elevation view of the substrate 116 and support member 124 of the alternate assembly 137. The assembly 137 provides an alternate mechanism to achieve planarization of an interconnect circuit 132 against a test die (not shown). The substrate 116 and the support member 124 are formed from a single semiconductor wafer. A rectangular groove is formed completely through the wafer so as to form a gap 127 that separates the support member 124 from rest of the substrate 116. An inner perimeter of the substrate 116 defines the outer edge of the gap 127. The inner edge of the gap is defined by the support 124. The gap 127 can be formed using processes similar to those used to form the opening 18 in the embodiment first described above. The interconnect circuit spans the gap opening 127 forming a narrow flexible membrane that circumscribes the support member 124.

The interconnect circuit 132 and a fence 123 overlay top surfaces of the substrate 116 and the support member 124.

I/O pads 136 are formed about the top perimeter of the assembly 137. Bottom surfaces of the substrate 116 and the support member 124 are placed on to a resilient layer 139 formed from a resilient material such as an elastomer.

The carrier 137 of the alternative embodiment can be secured between top and bottom caps (not shown) similar to those described for the embodiment first described above. The resilient layer 139 can flex together with the interconnect circuit 132 that spans the gap 127. This keeps the contact pads 140, which are exposed on a top surface of the circuit 132, in a planar relationship with each other and thereby facilitates electrical contact with corresponding die contact pads (not shown). The gap 127 and the membrane that overlays it permit surface planarization between the contact pads 140 and the die pads 145, thus reducing the force required to make contact between the two types of pads.

Figure 11:
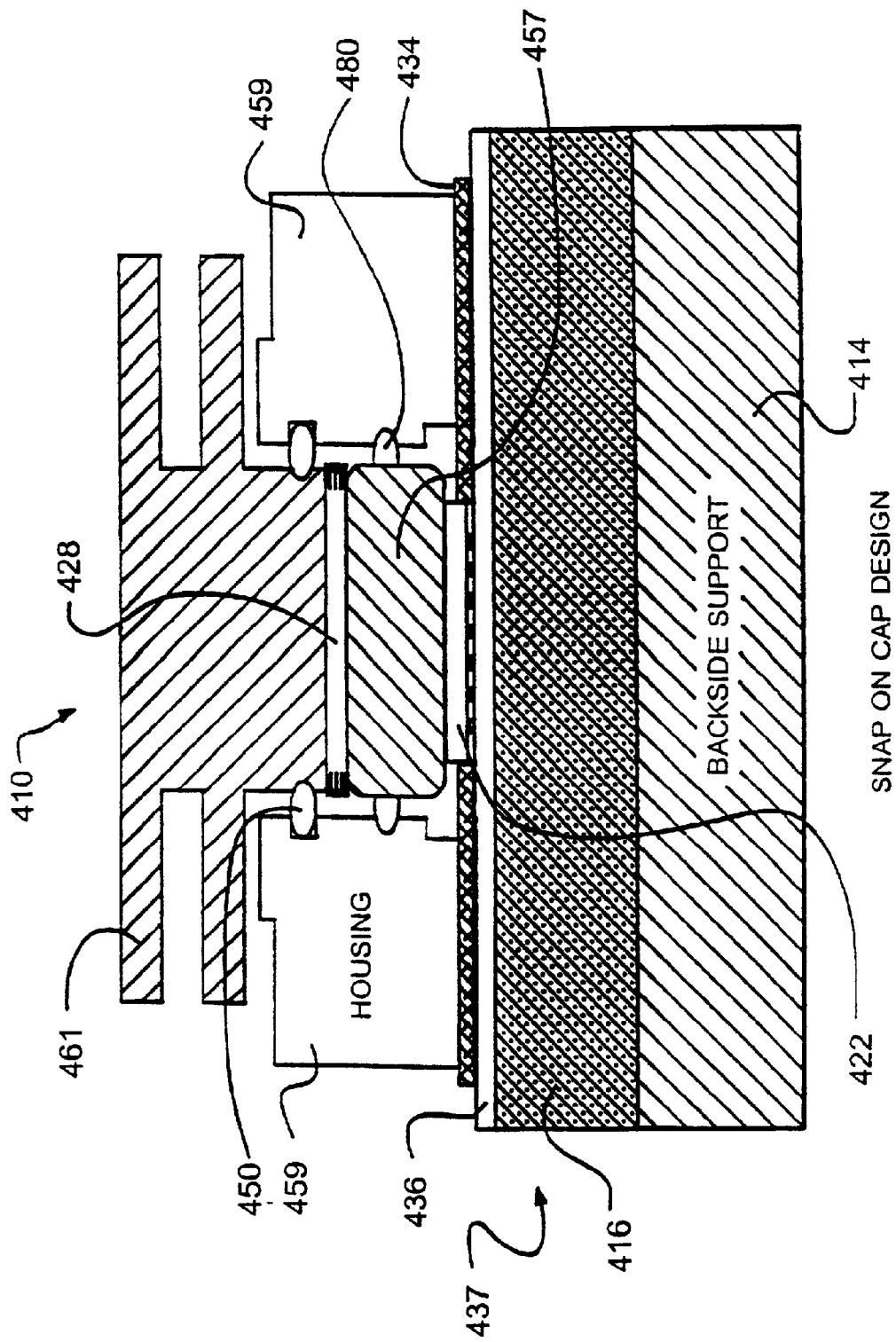
FIGS. 11, 12A, 12B, 13A and 13B show alternate carriers that use different mechanisms for providing a force to the die/interconnect circuit interface in accordance with the invention.

FIGS. 11, 12A–B and 13A–B show three alternate mechanisms for applying a force to the die/interconnect circuit interface. In FIG. 11, the die 422 is placed on the substrate/interconnect circuit assembly 437. A locking collar 459 is secured to the substrate/interconnect circuit assembly 437 inside the I/O pads 436. An oblong locking spring 450 engages a metal piston 461 inserted within the collar 459. The piston 461 compresses a spring and/or elastomer member 428 disposed between the die interface 457 and the piston 461. The piston assembly includes an elastomer 428 and a bottom piece 457 that rests against the die. The piston "snaps" in and out to alternately hold the die in place or allow its removal. Ball seal 480 is part of the locking collar 459 which provides environmental protection to the die 422 and substrate 437 interface.

Figure 12B:
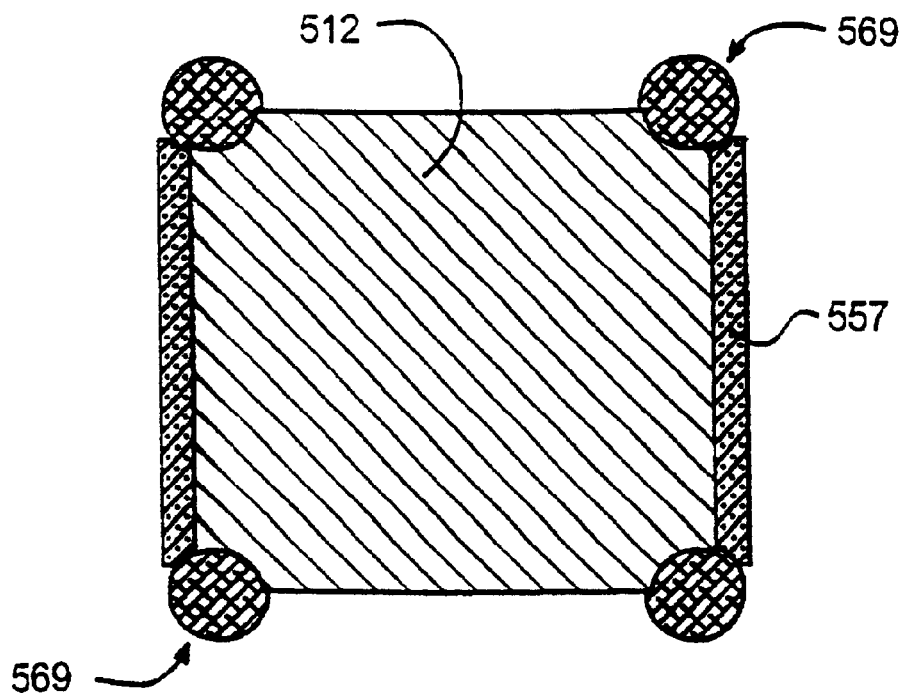
Figure 12A:
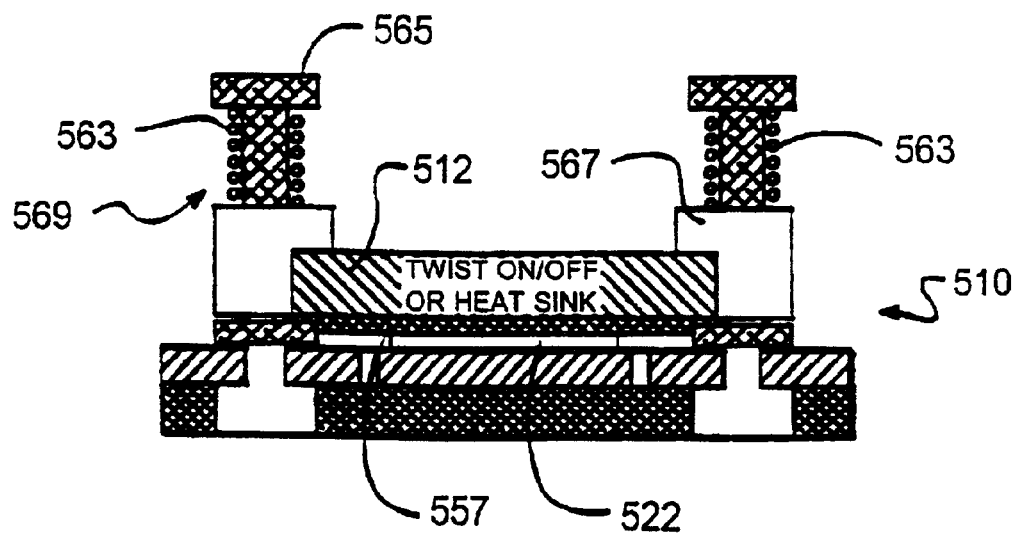

FIGS. 12A and 12B show another alternative carrier 510 in which springs 563 engage fixed top stops 565 and slideable bottom stops 567 and urge the stops apart. The top stops 565 are located in fixed positions on each of four corner posts 569. The bottom stops 567 are disposed at four corners of the carrier substrate and are slideable along the posts 569. The die holder 527 protects the die 522 from rotating when the cap 512 is twisted into position. The springs 563 provide a downward force against the bottom stops 567 which abut against the top cap 512 and push it downward as well.

Figure 13B:
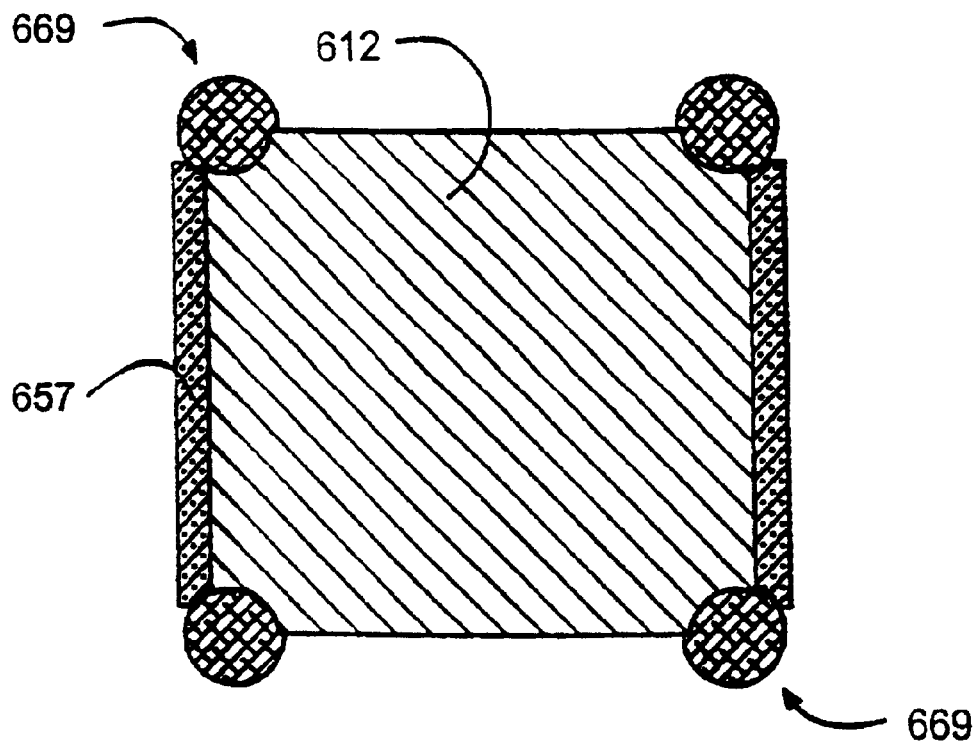
Figure 13A:
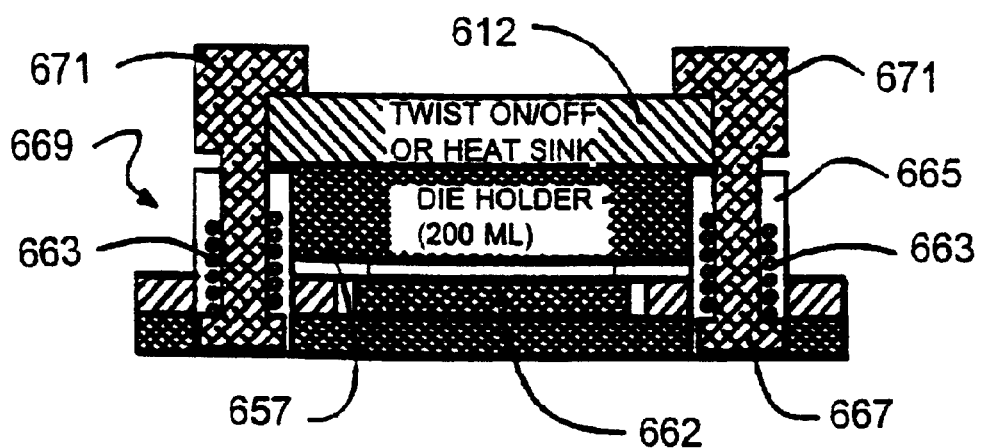

FIGS. 13A and 13B show another alternate carrier 610 in which springs 663 are fixedly secured to bottom stops 667 of each of four corner posts 669. The springs 663 are disposed between the bottom stops 667 which move with the posts 669 and fixed top stops 665. The posts 669 are slideable upward and downward. The springs 633 urge the posts 669 downward when the top cap 612 is in place. The die 662 is mounted in a die protector 657. The die protector 657 protects the die from rotating during twist on/off of the cap 612. The springs 663 provide a downward force against the top cap 612.

Figure 14B:
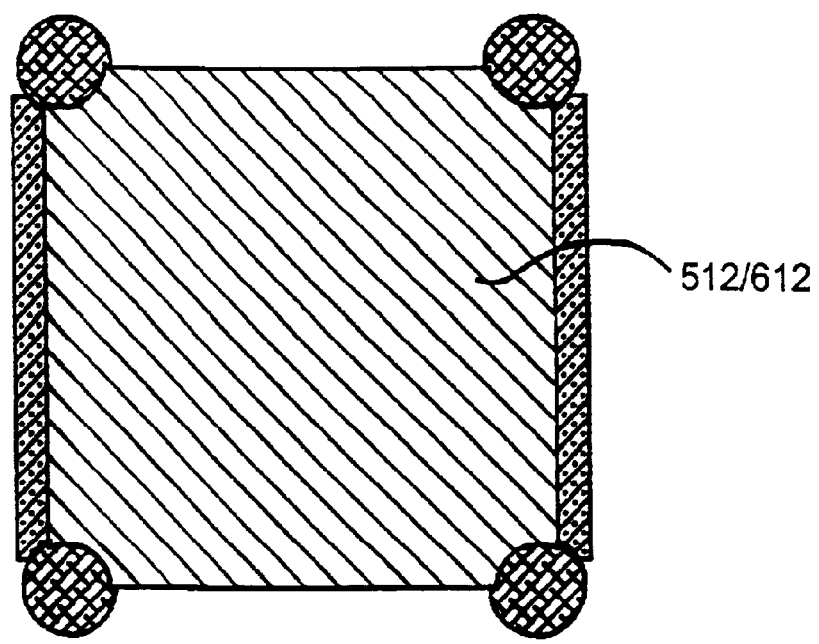
FIGS. 14A and 14B show the manner of rotating the top cap into place for the embodiments of FIGS. 12A–B and 13A–B.
Figure 14A:
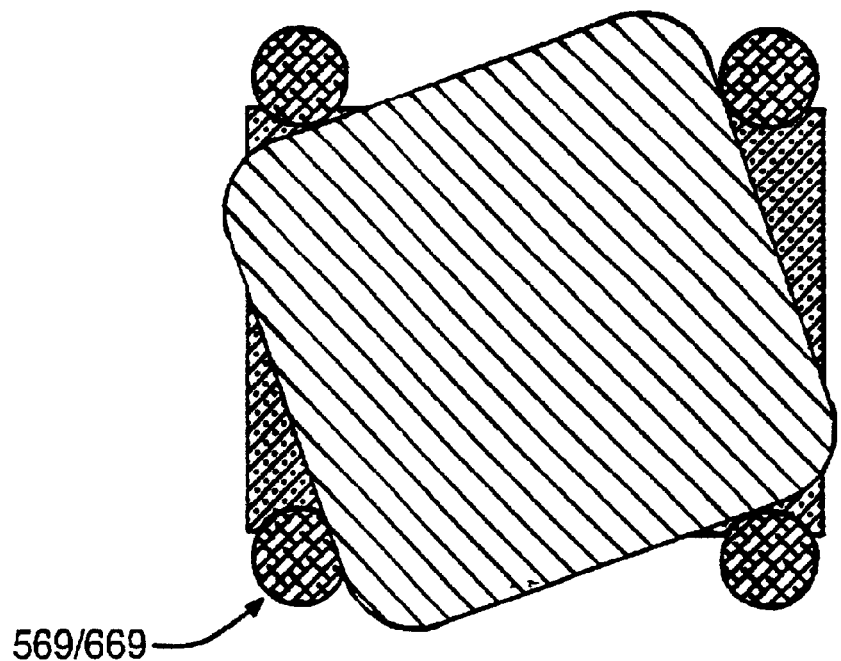
Figure 15:
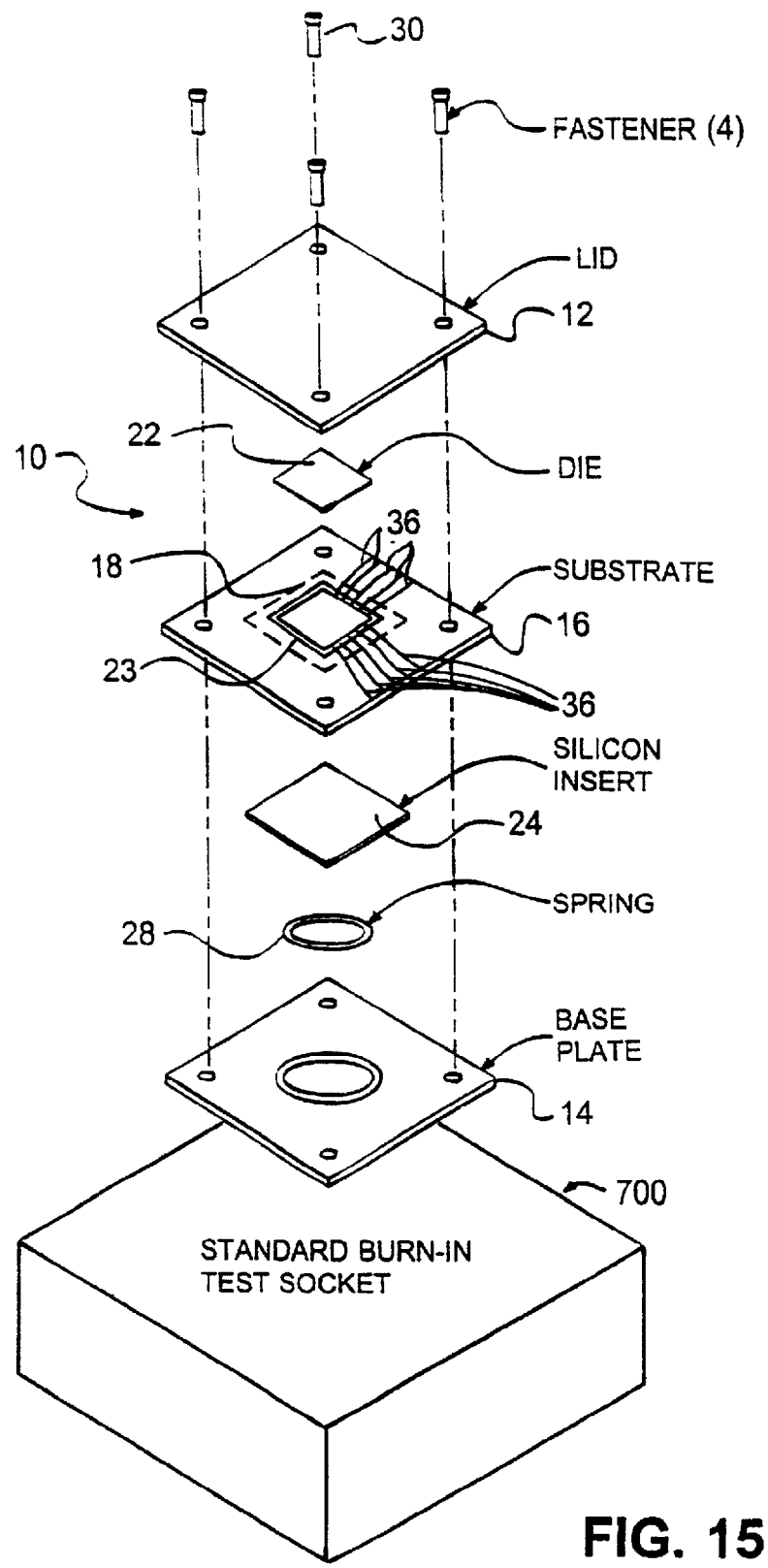
FIG. 15 is an exploded perspective view of a carrier and socket in accordance with the present invention.

FIGS. 14A and 14B explain how the top caps are inserted for both FIGS. 12A–B and 13A–B. First, the top cap 512/612 is inserted as shown in FIG. 14B. Then it is twisted to the position shown in FIG. 14B. In the case of FIGS. 12A–B, as the twisting takes place, the corners of the top cap 512 engage the underside of the bottom stop 567 and force it toward the top stop 565 (which is fixed) causing compression of the spring 563. In the case of FIGS. 13A–B, as the twisting takes place, the corners of the top cap 612 engage the underside of the post tops 671 and force them upwards causing compression of the spring 663. In =each case, the top cap 512/612 is urged by spring force toward the die/interconnect circuit interface. The amount of force applied to the interface depends upon the compression of the spring.

Various modifications to the preferred embodiment can be made without departing from the spirit and scope of the invention. Thus, the foregoing description is not intended to limit the invention which is described in the appended claims in which:

What is claimed is:

1. A temporary carrier assembly comprising:
    a substrate/interconnect circuit having
        device contact pads adapted to make contact with a semiconductor device,
        input/output pads, and
        electrical conductors that connect the device contact pads with the input/output pads;
    a top cap that is not connected electrically to the substrate/interconnect circuit; and
    at least one fastening mechanism for selectively holding the substrate/interconnect circuit and top cap together to form the temporary carrier assembly with the semiconductor device between them and, when they are being held together, for forcing the semiconductor device against the device contact pads.

2. The assembly of claim 1 wherein the substrate/interconnect circuit comprises a substrate.

3. The assembly of claim 2 wherein the device contact pads, the input/output pads, and the electrical conductors are coupled to the substrate.

4. The assembly of claim 1 wherein the substrate/interconnect circuit includes a compliant region.

5. The assembly of claim 4 wherein the support comprises a substrate and the compliant region comprises a thinned region of the substrate.

6. The assembly of claim 4 wherein the compliant region comprises a membrane.

7. The assembly of claim 6 wherein:
    the substrate/interconnect circuit comprises a substrate having an opening, and the membrane extends across the opening.

8. The assembly of claim 2 wherein the substrate/interconnect circuit further comprises a bottom cap.

9. The assembly of claim 8 wherein the bottom cap is rigid.

10. The assembly of claim 8 wherein the substrate/interconnect circuit further comprises a support mounted on the bottom cap to urge a plurality of device contact bumps into a common plane.

11. The assembly of claim 1 wherein the input/output pads do not substantially project from the substrate/interconnect circuit.

12. The assembly of claim 1 wherein the substrate/interconnect circuit comprises a membrane.

13. The assembly of claim 12 wherein the membrane comprises a polymer dielectric.

14. The assembly of claim 12 wherein the substrate/interconnect circuit comprises a substrate and a thin film interconnect extending over a top surface of the substrate, the membrane being a portion of the thin film interconnect.

15. The assembly of claim 14 wherein the carrier assembly further comprises a support configured to contact a bottom surface of the membrane to urge a plurality of device contact bumps into a common plane.

16. The assembly of claim 15 in which the support comprises a semiconductor element.

17. The assembly of claim 15 in which the support comprises a flexible member.

18. The assembly of claim 17 in which the support comprises an elastomer.

19. The assembly of claim 15 in which the support comprises a spring and a shim.

20. The assembly of claim 15 in which the support comprises an elastomer and a spring.

21. The assembly of claim 15 in which the insert comprises a spherical ball bearing.

22. The assembly of claim 1 wherein the coefficient of thermal expansion of the substrate/interconnect circuit substantially matches the coefficient of thermal expansion of the semiconductor device.

23. The assembly of claim 1 wherein the substrate/interconnect circuit further comprises a fence configured to receive the semiconductor device.

24. The assembly of claim 1 wherein the device contact pads have rough surfaces.

25. The assembly of claim 24 wherein the rough surfaces are formed of oxide penetrating particles.

26. The assembly of claim 1 wherein the top cap is spring biased.

27. The assembly of claim 26 wherein the lid further comprises posts coupled to the support; a cap configured to be selectively coupled to the posts; and a resilient mechanism that exerts a force between the cap and the semiconductor device when the cap is coupled to the posts.

28. The assembly of claim 1 wherein the input/output pads are adapted to couple to a printed wiring board.

* * * * *